(12) United States Patent
Aakjer

(10) Patent No.: US 7,277,340 B2
(45) Date of Patent: Oct. 2, 2007

(54) SMART MEMORY READ OUT FOR POWER SAVING

(75) Inventor: Thomas Aakjer, Munich (DE)

(73) Assignee: Dialog Semiconductor GmbH, Kircheim/Teck-Nabern (DE)

( * ) Notice: Subject to any disclaimer, the term of this patent is extended or adjusted under 35 U.S.C. 154(b) by 659 days.

(21) Appl. No.: 10/876,802

(22) Filed: Jun. 25, 2004

(65) Prior Publication Data

US 2005/0283582 A1   Dec. 22, 2005

(30) Foreign Application Priority Data

Jun. 18, 2004   (EP) ................................. 04368044

(51) Int. Cl.
*G11C 7/00*   (2006.01)

(52) U.S. Cl. ...................... 365/205; 365/205; 365/196; 365/233

(58) Field of Classification Search ................. 365/205
See application file for complete search history.

(56) References Cited

U.S. PATENT DOCUMENTS 5,491,655 A  *  2/1996  Hirose et al. ............... 365/177
6,008,821 A     12/1999 Bright et al. ............... 345/504
6,275,441 B1    8/2001  Oh ........................ 365/230.04
6,510,095 B1    1/2003  Matsuzaki et al. .......... 365/222
2003/0081487 A1 5/2003  Mizugaki .................. 365/222
2004/0044921 A1 3/2004  Sakaino et al. ............. 713/400
2004/0114440 A1 6/2004  Shu et al. ............... 365/189.05

* cited by examiner

*Primary Examiner*—Thong Q. Le
(74) *Attorney, Agent, or Firm*—Saile Ackerman LLC; Stephen B. Ackerman

(57) ABSTRACT

A method and a circuit are given, to implement and realize power saving Sense Electronics Endowed (SEE) memory using modified memory read cycles, named as Smart Memory Readout (SMR). In an SMR-mode read cycle, the memory is only active a small fraction of a clock cycle thus saving power. In this small fraction where the memory is enabled by SMR-mode read, the memory content is read to a shadow register and held until read by the microcontroller. Said circuit and method are designed in order to be implemented with a very economic number of components, capable to be realized with modern integrated circuit technologies.

41 Claims, 6 Drawing Sheets

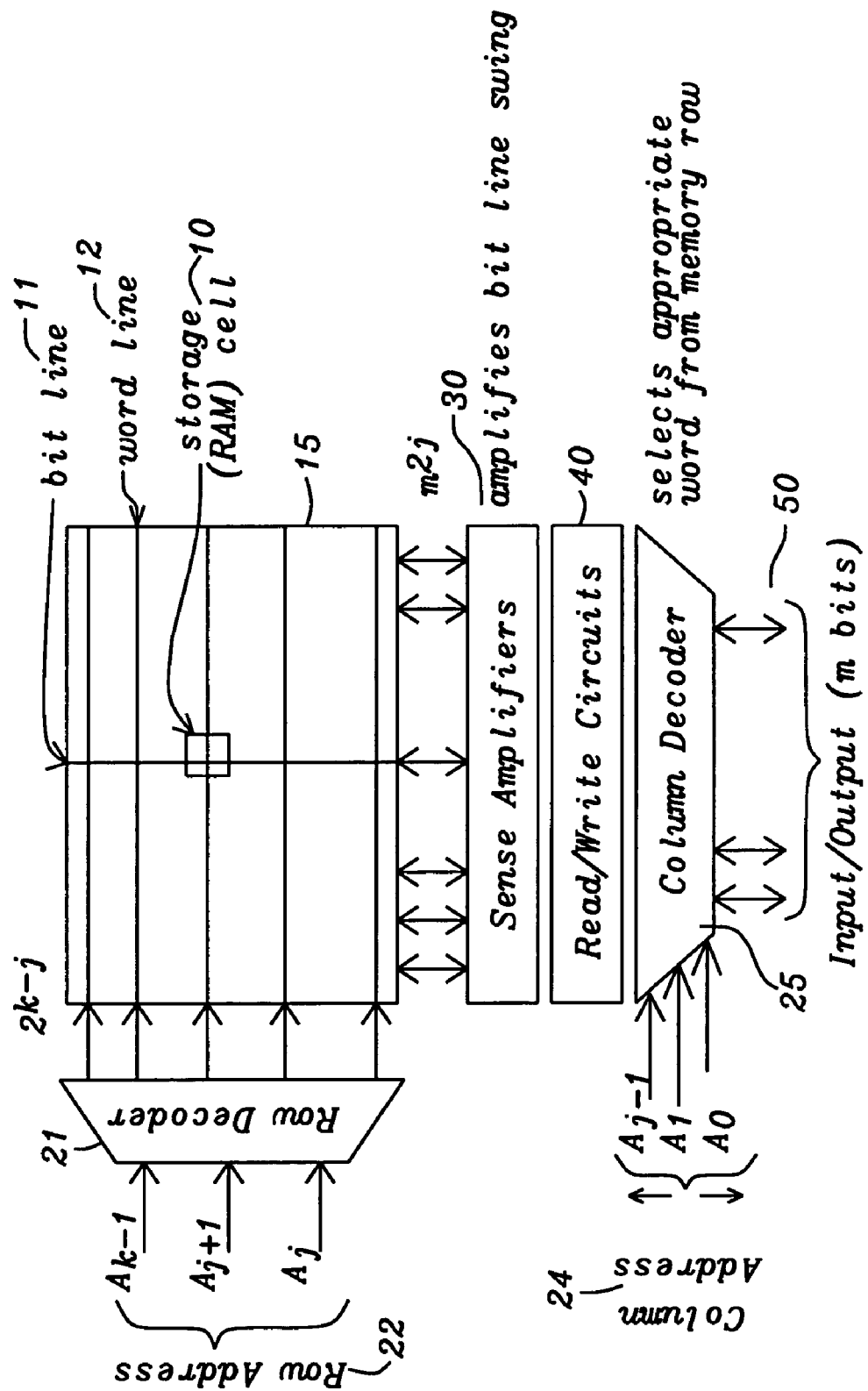
FIG. 1 – Prior Art

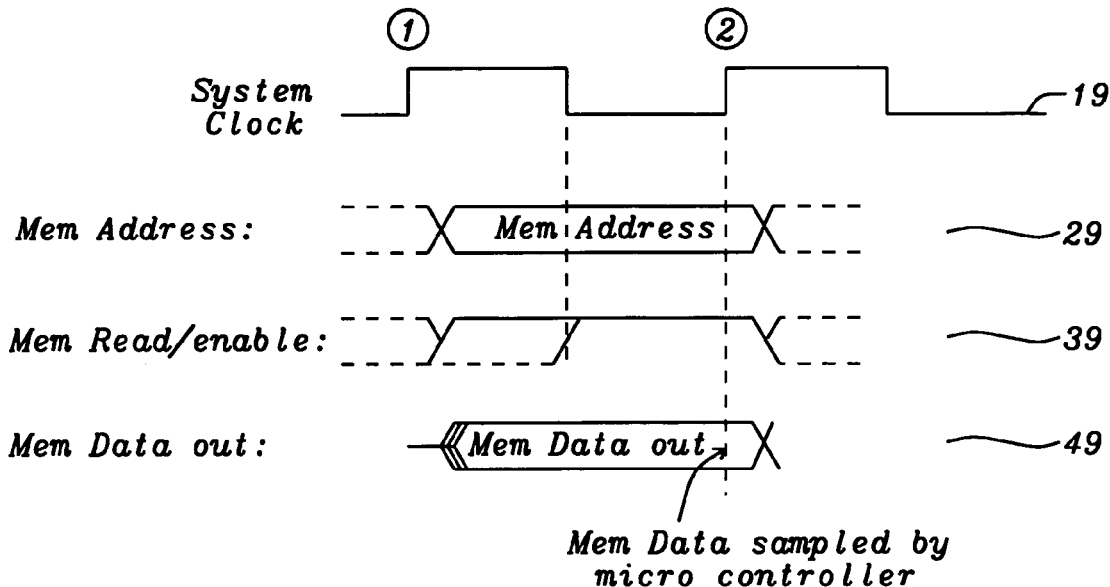
FIG. 2A - Prior Art
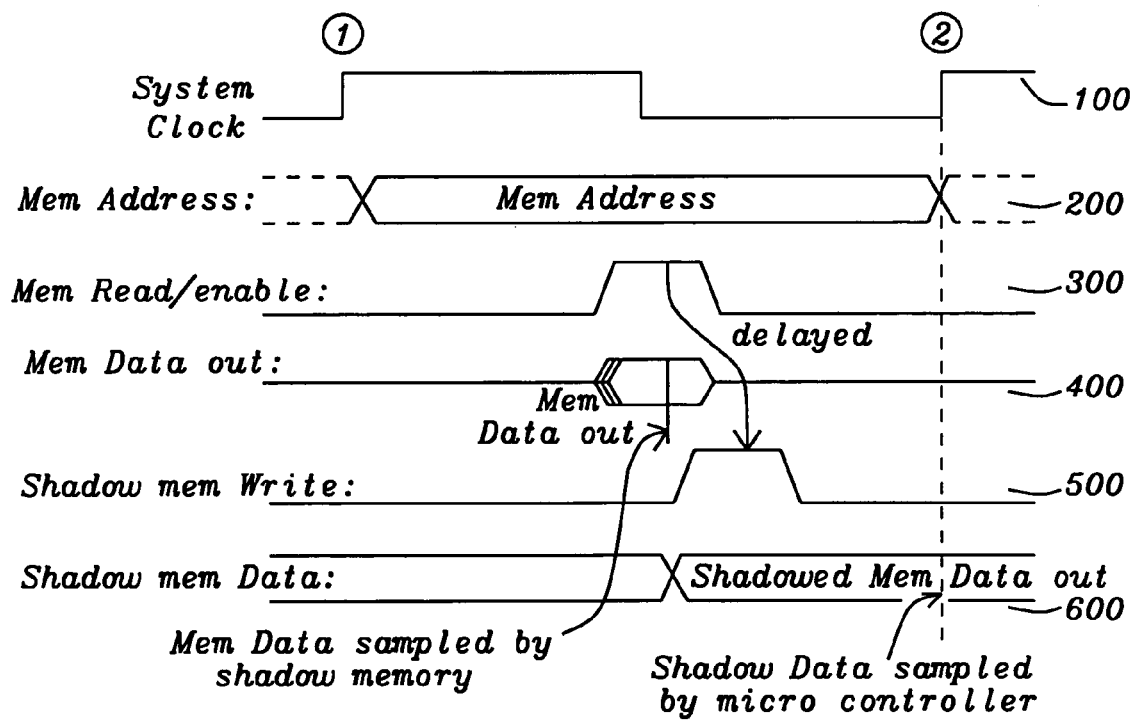
FIG. 2B

701 — Provide a Sense Electronics Endowed (SEE) memory array for realizing an SEE-memory device with Smart Memory Readout (SMR) capabilities using an SMR-mode read cycle operation for main data storage with internal "Mem Address", "Mem Read/enable" signals, and internal "Mem Data out" data needed within a memory read cycle, controlled by a "System Clock" clock signal and having external Address bus and Data I/O bus systems 702 — Provide a Shadow Memory device for intermediate data storage with an internal "Shadow mem Write" signal and internal "Shadow mem Data" data as necessitated during said SMR-mode read cycle operation, also controlled by said "System Clock" clock signal 703 — Provide SMR control logic for realizing a timing schedule implementing a Smart Memory Readout (SMR) read cycle operation for said SEE-memory device for main data storage in conjunction with said Shadow Memory device for said intermediate data storage 710 — Enable a low-power operating mode for said Random Access Memory SEE-memory device with said Smart Memory Readout (SMR) mode read cycle by drastically reducing the frequency of said "System Clock" clock signal (A)

*FIG. 3A*

SMART MEMORY READ OUT FOR POWER SAVING

BACKGROUND OF THE INVENTION (1) Field of the Invention

The invention relates generally to data storage in semiconductor memory devices and more particularly, to memory devices equipped with sense amplifiers or additional read-out electronics such as Read Only Memory ROM, Flash memory, Random Access Memory (RAM), and also Magnetic RAM (MRAM). These memories will in the following altogether be subsumed for brevity under the designation of Sense Electronics Endowed (SEE) memories. Even more particularly this invention is relating to the timing schedule during memory read of a memory read/enable transition signal in an SEE memory device with reduced power consumption.

(2) Description of the Prior Art

Microprocessor systems can be found nowadays working in many devices, such as Personal Computers (PCs) especially modern portable notebook computers, in Personal Data Assistants (PDAs), mobile phones, navigation systems—mostly also used as portable devices, but also in many household appliances, in automobiles etc. and they all have Central Processing Units (CPUs) which need some sort of Random Access Memory (RAM) for their primary workspace (in RAM the code and data for the CPU are stored) usually implemented as semiconductor memory, wherein the contents of each byte can be directly and randomly accessed. Other types of memory chips, including ROMs and PROMs have this property as well, but only RAM chips are economically priced however they require power to maintain their content. The most common type of computer memory in current solid-state memory technology for main memory storage, which usually uses one transistor and a storage capacitor to represent a bit, is called Dynamic RAM (DRAM). Therein the capacitors must be energized hundreds of times per second in order to maintain the charges, representing the stored information as data. A data bus system is used for moving the information in and out of the RAM storage and an address bus addresses the storage location of the information data within the RAM. The RAM is usually organized in a grid or matrix configuration, where each bit is stored in its own data cell and each row and column has its own address. Another implementation called Static RAM (SRAM) is a type of RAM that holds data without need to refresh the stored content. An SRAM bit is made up of 4 to 8 transistors and is therefore very fast, with access times in the 10 to 30-nanosecond range but also power dissipating and expensive to produce. In comparison, DRAM only uses one transistor per memory cell and has access times, which are usually above 30 ns. SRAM does not require any refreshing operation and is easily handled, but is more expensive than DRAM and has a smaller capacity than DRAM comparing the same chip area. Because of these properties, SRAM is used to create a CPU's speed-sensitive cache, while DRAM is used for the larger system main storage RAM space. The memory internal operations during read, write, and refresh transactions are governed by a number of control signals allowing to strobe or clock addresses and data in and out, and to partially select, enable or inhibit these operations. All these operations are more or less power consuming, which leads especially with portable devices to reduced power-on times, as these devices are dependent from the energy capacity stored in their battery. It is therefore important to reduce power consumption during operation of the device, and the operation of the memory especially.

In the prior art, there are different technical approaches for achieving the goal of a reduction of power consumption. However these approaches use often solutions, which are somewhat technically complex and therefore also expensive in production. It would be advantageous to reduce the expenses in both areas. This is achieved by using a transitional de-activation process for parts of the memory operation, when not in full service. Using the intrinsic advantages of that solution—as described later on in every detail—the circuit of the invention is realized with standard CMOS technology at low cost.

Preferred prior art realizations are implementing such related memory circuits in single chip or multiple chip solutions as integrated circuits. The permanent high power requirement and therefore high system costs are the main disadvantages of these prior art solutions. It is therefore a challenge for the designer of such devices and circuits to achieve a high-quality but also low-cost solution.

Several prior art inventions referring to such solutions describe related methods, devices and circuits, and there are also several such solutions available with various patents referring to comparable approaches, out of which some are listed in the following:

U.S. Pat. No. 6,008,821 (to Bright et al.) describes an embedded frame buffer system and synchronization method, wherein a multiple embedded memory frame buffer system includes a master graphics subsystem and a plurality of slave graphics subsystems. Each subsystem includes a frame buffer and a color palette for decompressing data in the frame buffer. The master subsystem further includes a digital to analog converter coupled to receive the decompressed digital data from the palette of each subsystem and outputting analog versions of the digital data to an output device. The system further includes a timing system for determining which outputs of the subsystems are to be converted by the digital to analog converter at a given time. A method of synchronization of embedded frame buffers for data transfer through a single output includes the steps of generating a first clock signal and a second clock signal in a master embedded frame buffer, sending the first and second clock signals to a slave embedded frame buffer and delaying the second clock signal to be in phase with a third clock signal generated by a graphics controller such that no data is lost when transferring data from the master and slave embedded frame buffers.

U.S. Patent Application 2003/0081487 (to Mizugaki) discloses a semiconductor memory device whereby the technique of the present invention sets a time period of a level H between a rise and a fall of an ATD signal (that is, a pulse width of the ATD signal) to be not shorter than a preset allowable address skew range and not longer than a time period between a timing of a rise of the ATD signal, at which the refreshing operation starts, and conclusion of the refreshing operation. This arrangement ensures generation of an appropriate ATD signal even when an address skew occurs in an externally given address.

U.S. Patent Application 2004/0044921 (to Sakaino et al.) describes an integrated circuit device externally connected with a peripheral device operated by a first clock signal. The integrated circuit device includes a CPU having information on the frequency of the first clock signal, a clock generator generating a second clock signal for operating the CPU and outputting third clock signals obtained from the second clock signal and a clock halt portion receiving the third clock signals and selectively outputting only one of the third clock signals according to the information. The integrated circuit device further includes a timer activated only when receiving the one of the third clock signals and converting the frequency of the received clock signal for output and a clock synchronization serial port receiving the clock signal outputted from the timer and one of the other third clock signals, and supplying either one of the received clock signals to the peripheral device according to the information The basic RAM circuit is shown in FIG. 1 prior art in form of a modified circuit diagram (i.e. with graphical representation of the memory array as grid layout) with a storage (RAM) cell 10 as central component, wherein the information is stored as a single bit, in this case. Arranging these data storage cells 10 in form of a rectangular grid unfolds the core bit/word (X/Y) organized memory array element, with horizontal rows 12 and vertical columns 11 spanning a storage matrix 15 with Cartesian X and Y coordinates identifying the X/Y data cell location 10 and in such a way setting up the main storage area organized in bits (X) and words (Y). In technical terms the columns are designed as bit lines 11 and the rows as word lines 12, the storage (RAM) cells 10 can be implemented as single transistor-capacitor DRAM or multiple transistor SRAM cells, or even as formerly used magnetic cores or MRAM (Magnetic RAM) devices of late. This memory array is now addressed through the address bus system from the processor CPU with addresses made up of a Row Address 22 part and a Column Address 24 part, the Row Address 22 part being decoded in a Row Decoder 21 and the Column Address 24 part being decoded in the address part of a Column Decoder 25. The Row Decoder 21 is then activating the according word line 12, whereas the address part of the Column Decoder 25 activates the according bit line 11. Depending on the operation to be performed a Write, Read or Refresh cycle for the selected storage (RAM) cell 10 is then executed. Therefore Read/Write Circuits 40 are activated, performing the according bitwise data operations with the help of Sense Amplifiers 30 and acting on the particular storage (RAM) cells 10. The relevant data are delivered via said Column Decoder 25 too, having additionally a data part, connected to the Input/Output data bus system of the CPU. These data are therefore written into or read from the main memory array in parallel with the help of said Column Decoder 25 connected to said Read/Write Circuits 40 and these further connected on their part to said Sense Amplifiers 30 writing or reading the contents of the connected storage (RAM) cells 10. Refresh operations are essentially made up of a combination of Read/Write operations. The length of the address as shown in the figure is k bits and depends on the size of the addressable memory— defining also the bus width of the address bus, and the length of the data word as shown in the figure is M bits and depends on the CPU type—determining also the bus width of the data I/O bus.

In FIG. 2A prior art a timing diagram shows the time response of the relevant signals during a normal memory read cycle, describing the two critical points of time named ADDRESS and DATA (shown respectively as 1 and 2 encircled) of the "System Clock" signal 19 used as clock signal, where the two main actions of a normal memory read cycle are triggered. The rising edge at point of time ADDRESS (1 encircled) of the "System Clock" signal 19 thereby triggers the addressing of the memory, which indicates that a valid address is being applied now via its address bus shown with signal "Mem Address" 29 and being kept valid until point of time DATA (2 encircled), where the memory data for this valid address can now be read out as signal "Mem Data out" 49. For technical reasons accounting and providing for eventually occurring signal transit times between point of time ADDRESS and the final validity of the complete address made up of k bits a delayed sampling at point of time DATA is necessary, where all M bits of the data word are considered to be valid. This effect is called address skewing, by the way. Now either during this whole duration of time or more often during one half of that time (corresponding to one half of the "System Clock" period) a "Mem Read/enable" 39 signal is set, allowing or better forcing the Sense Amplifiers 30 and the Read/Write Circuits 40 to operate. A substantial part of the power consumption i.e. power loss of the memory is due to that fact. Aiming now our attention to FIG. 2A prior art again this course of events is not only proceeding during a real read operation, it has to be repeatedly handled also during the many refresh cycles as adumbrated with the dashed lines in the figure, and finding a procedure enhancing and ameliorating this performance is therefore a challenge for the designer of such devices and circuits, thus achieving a high-quality and also low-cost solution, avoiding these drawbacks.

Although these patents and papers describe circuits and/or methods close to the field of the invention they differ in essential features from the method, the system and especially the circuit introduced here.

SUMMARY OF THE INVENTION

A principal object of the present invention is to realize a circuit for reading Sense Electronics Endowed (SEE) memory devices with reduced power consumption in form of very manufacturable integrated circuits at low cost.

Another principal object of the present invention is to provide an effective and very manufacturable method for operating SEE-memory devices with modified read/enable cycles designated as Smart Memory Readout (SMR) cycles, in such a way that power consumption is reduced.

Another further object of the present invention is to attain SEE-memory devices, which are only active during said modified read/enable periods in SMR-mode.

Another still further object of the present invention is to reach a power loss reduction for systems using SEE-memory devices.

A still further object of the present invention is to reduce the power consumption of battery powered devices by putting into effect design features, resulting from said newly introduced SMR-mode control.

Another further object of the present invention is to reduce the cost of manufacturing by implementing the circuit as a monolithic integrated circuit in low cost CMOS technology.

Also an object of the present invention is to enhance the battery lifetime and at the same time to thereby reach a low-cost realization with modern integrated circuit technologies.

Further another object of the present invention is to give a method, whereby the period of operating said sense electronic is kept as short as possible for maximum power saving but still guaranteeing proper read-out.

In accordance with the objects of this invention, a new circuit is described, capable of realizing a Sense Electronics Endowed (SEE) memory device with Smart Memory Read (SMR) technique, comprising a Sense Electronics Endowed (SEE) memory device using an SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems, comprising further a Shadow Memory device for intermediate data storage with an internal "Shadow mem Write" signal and internal "Shadow mem Data" data as necessitated during said SMR-mode read cycle operation, also controlled by said "System Clock" signal; and also comprising a control logic module for realizing a timing schedule implementing an SMR-mode read cycle operation for said SEE-memory device as an operation with a modified read cycle compared to normal memory read cycles characterized by a 'to a fraction of a normal read/enable impulse duration shortened' SMR-mode memory read/enable impulse duration for said "Mem Read/enable" signal of said SEE-memory device, and by its equally important "Mem Read/enable" signal position as 'suitable location for proper read timing'.

Also in accordance with the objects of this invention, a new method is described, capable of implementing a Sense Electronics Endowed (SEE) memory device with Smart Memory Readout (SMR) capabilities, comprising: providing a Sense Electronics Endowed (SEE) memory device using an SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems; providing a Shadow Memory device for intermediate data storage with an internal "Shadow mem Write" signal and internal "Shadow mem Data" data as necessitated during said SMR-mode read cycle operation, also controlled by said "System Clock" signal; providing control logic for realizing a timing schedule implementing a Smart Memory Readout (SMR) read cycle operation for said SEE-memory device for main data storage in conjunction with said Shadow Memory device for said intermediate data storage; enabling a low-power operating mode for said Sense Electronics Endowed (SEE) memory device with said Smart Memory Readout (SMR) mode read cycle by drastically reducing the frequency of said "System Clock" signal; generating said Smart Memory Readout (SMR) read cycle as modified read cycle compared to normal memory read cycles characterized by a 'to a fraction of a normal read/enable impulse duration shortened' SMR-mode memory read/enable impulse duration for said "Mem Read/enable" signal of said SEE-memory device for main data storage and by its equally important "Mem Read/enable" signal position as 'suitable location for proper read timing'; reading valid memory data out of said SEE-memory device for main data storing according to said "Mem Address" signals from said external Address bus during activity of said shortened SMR-mode "Mem Read/enable" signal of said SEE-memory device for main data storage from "Mem Data out" data into said "Shadow mem Data" data; transferring said "Mem Data out" data from said SEE-memory device into said Shadow Memory device for intermediate data storage triggered by said internal "Shadow mem Write" signal as said "Shadow mem Data" data during said SMR-mode read cycle operation; and reading valid memory data out of said Shadow Memory device for intermediate data storing during activity of said normal "Mem Read/enable" signal of said SEE-memory device for main data storage out of said "Shadow mem Data" data onto said external data I/O bus.

BRIEF DESCRIPTION OF THE DRAWINGS

In the accompanying drawings forming a material part of this description, the details of the invention are shown:

FIG. 1 prior art shows a basic RAM circuit in form of a modified circuit diagram (i.e. with a graphical representation of the memory array as grid or matrix layout).

FIG. 2A prior art depicts the actual prior art operating of the basic RAM circuit of FIG. 1 prior art with the help of a timing diagram showing the time response of the relevant signals during a normal memory read cycle.

FIG. 2B depicts the timing diagram showing the time response of the relevant signals during a memory read cycle designated Smart Memory Read (SMR) cycle, now enhanced by an additional, modified "Mem Read/enable" signal for a preferred embodiment of the present invention with Smart Memory Read (SMR) technique and implementable with a variety of modern monolithic integrated circuit technologies.

FIGS. 3A & 3B describe with the help of a flow diagram the according method for constructing and operating a Sense Electronics Endowed (SEE) memory device with Smart Memory Read (SMR) technique circuit as shown in FIG. 2B.

DESCRIPTION OF THE PREFERRED EMBODIMENTS

Figure 3B:
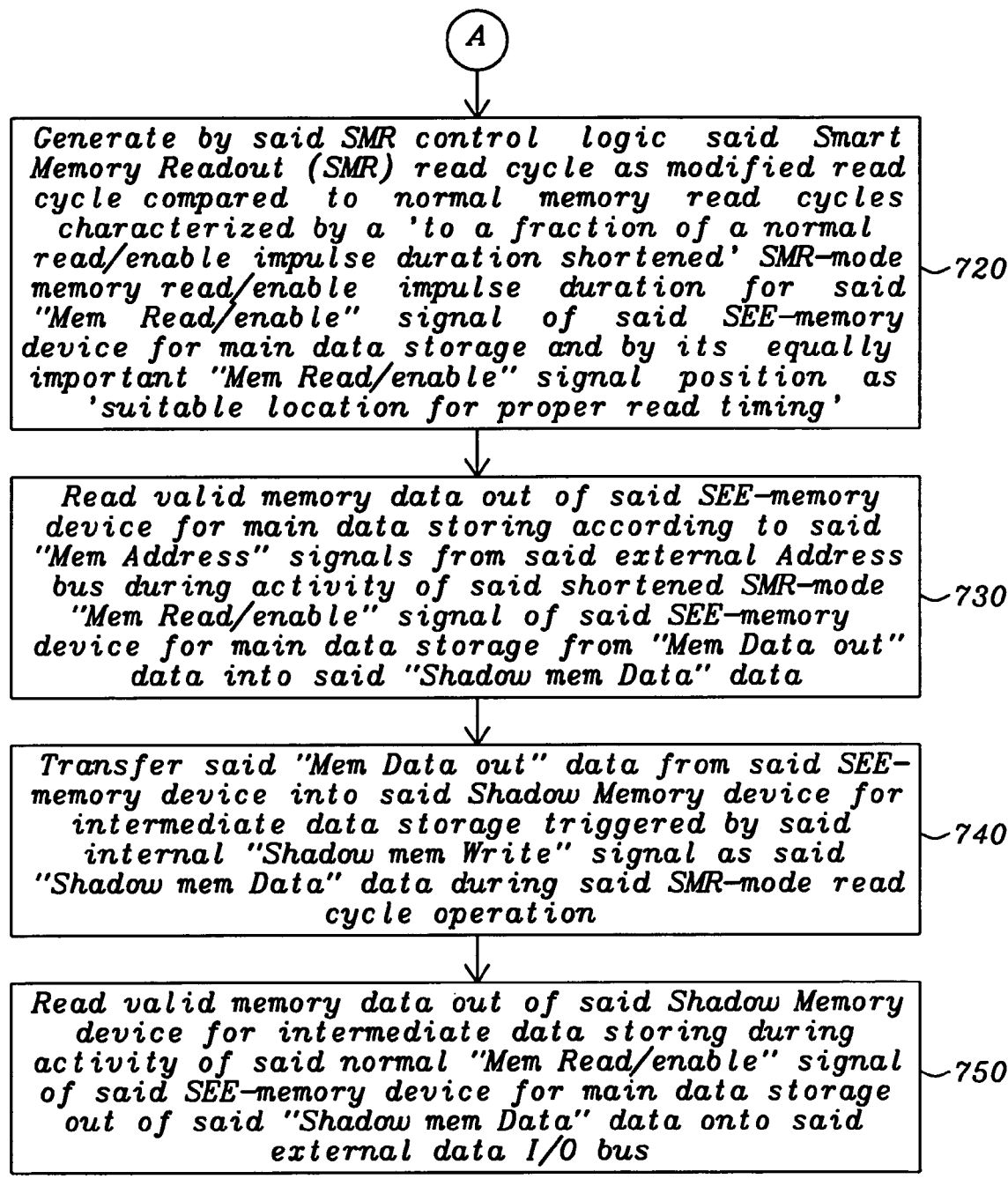

The preferred embodiment discloses a novel mode of operation for semiconductor memory of the Sense Electronics Endowed (SEE) memory type, named Smart Memory Readout (SMR) for power saving with asynchronous readout combined with shadow registers. In modern System On a Chip (SOC) systems, the on chip memory normally consumes high current in active mode due to enduring operating the sense amplifiers. This high current consumption is a problem in low power modes, where the microcontroller core cannot be turned off but is operating at e.g. reduced frequency but still needs to access program memory. In low power mode, with the controller system clock frequency reduced, the Smart Memory Readout (SMR) mode will reduce memory current and power consumption, as the memory is only activated during the time of the SMR mode read operation. In low power mode where the microcontroller system is operating at a very low frequency the main memory is normally working in de-activated mode, for activation a set of fast control signals is generated which reads out the wanted memory position in a fraction of the clock period, stores the data in intermediate memory e.g. Flip-Flops and de-activates the main memory again.

FIG. 2B shows the timing diagram of a read cycle using the modified SMR-mode read cycle of the invention. The clock pulse markers (1 encircled) and (2 encircled) indicate the start and the end of a typical memory read cycle from the view of the microcontroller, for abbreviation these points of time are named as ADDRESS and DATA respectively. In a normal read, the memory is typically enabled for read during a complete clock cycle or half a clock cycle. In the time, where the memory is enabled the power consumption of the memory is normally large as the sense amplifiers are enabled. Using SMR-mode read, the memory is only enabled during a small fraction of a clock period allowing the memory to be read into a shadow register built e.g. of Flip-Flops. The microcontroller will then read out the saved data from the shadow register instead of the memory directly. The control logic for the SMR-mode read can be realized using e.g. asynchronous logic (delay elements) if no other faster clock signal is available. Thus, as the memory is only enabled a small fraction of a clock period using SMR-mode read, the power consumption of the memory is reduced correspondingly which in modern low power systems may be crucial. The SMR-mode read will save power in every system operating with a clock rate resulting in reading speed specifications lower than the available memory speed, wherefore it is possible to reduce the active up-time of the memory to a fraction of the clock period. This will typically be the case in a low power mode where the operating frequency is drastically reduced compared to the normal operating frequency. The power saving reached is thereby inversely proportional to the enable time fraction of the novel memory read/enable signal related to the formerly used memory read/enable signal. In order to achieve the most in power saving this fraction should be chosen as small as possible.

Contemplating now FIG. 2B, the timing diagram of the new SMR method is explained. The "System Clock" 100 signal initiates with its rising edge at point of time ADDRESS (1 encircled) a memory read cycle, which means that all k new memory address bits are put on the address lines "Mem Address" 200, k being the width of the memory address bus and containing column and row address parts likewise and corresponding to the organization of the memory matrix. Due to address skewing, these address bits are not appearing instantaneously at the same time as valid addresses, therefore a certain delay is accounted for and the "Mem Read/enable" 300 signal is set only after said delay, usually in the second half of the read cycle determined by said "System Clock" 100 signal. Said "Mem Read/enable" 300 signal is now—i.e. in the case of the invention called SMR-mode—drastically shortened compared to a normal "Mem Read/enable" 39 signal as shown in FIG. 2A prior art. It is only set during a small fraction of the time normally used. Exactly during this period of time, i.e. "Mem Read/enable" 300 set, the memory data are read out as "Mem Data out" 400 from their storage locations i.e. as output data from the memory, that is from the M bits of the word being addressed just now and written into an intermediate shadow memory. The duration of said "Mem Read/enable" 300 signal shall thereby be not longer than necessary in order to get the greatest power saving effect possible. Said memory data is in the following written into said intermediate shadow memory, controlled by signal "Shadow mem Write" 500, which essentially may be only a delayed version of signal "Mem Read/enable" 300 and whereby the sampling of the shadow memory has to take place exactly during said "Mem Data out" 400 signals being valid, i.e. signal "Shadow mem Write" 500 sampling the "Mem Data out" 400 data with its rising edge precisely within said "Mem Data out" 400 data time window, guaranteeing valid memory data. Thus the "Mem Data out" 400 signals can be considered as result of signals "Mem Read/enable" 300. From thereon the data in the shadow memory can be considered as valid, signalized by signals "Shadow mem Data" 600, which are then read from the CPU with its normal memory read timings, i.e. the microprocessor doesn't see any difference compared to normal Sense Electronics Endowed (SEE) memory without SMR-mode.

What is clear from the above description is, that the new set of SMR-mode signals have to be sufficiently fast in order to work with modern high speed Sense Electronics Endowed (SEE) memory chips, and this SMR-mode reading being applicable with preference on low-power operation modes only with their drastically reduced clocking frequencies. The "Mem Data out" signals are available only during a shorter fraction of the read cycle with SMR-mode read cycles as compared to normal read modes. Operating memory with SMR-mode read cycles would then save power in every system operating with a clock rate resulting in reading speed specifications being lower than the normal operating memory speed specifications.

Regarding the flow diagram given in FIGS. 3A & 3B, a method, explaining the operation of the novel Sense Electronics Endowed (SEE) memory device with Smart Memory Readout (SMR) technique circuit according to the invention and exemplified with the timing diagram of FIG. 2B is now described and defined by its steps, wherein the first step 701 provides a Sense Electronics Endowed (SEE) memory device for realizing a SEE memory device with Smart Memory Readout (SMR) capabilities using a SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems. Step 702 provides a Shadow Memory device for intermediate data storage with an internal "Shadow mem Write" signal and internal "Shadow mem Data" data as necessitated during said SMR-mode read cycle operation, also controlled by said "System Clock" signal and step 703 provides control logic for realizing a timing schedule implementing a Smart Memory Readout (SMR) read cycle operation for said SEE memory device for main data storage in conjunction with said Shadow Memory device for said intermediate data storage. With step 710 a low-power operating mode is enabled for said Sense Electronics Endowed (SEE) memory device with said Smart Memory Readout (SMR) mode read cycle by drastically reducing the frequency of said "System Clock" signal. Step 720 then generates said Smart Memory Readout (SMR) read cycle as modified read cycle compared to normal memory read cycles characterized by a 'to a fraction of a normal read/enable impulse duration shortened' SMR-mode memory read/enable impulse duration for said "Mem Read/enable" signal of said SEE-memory device for main data storage and by its equally important "Mem Read/enable" signal position as 'suitable location for proper read timing', step 730 reads valid memory data out of said SEE-memory device for main data storing according to said "Mem Address" signals from said external Address bus during activity of said shortened SMR-mode "Mem Read/enable" signal of said SEE-memory device for main data storage from "Mem Data out" data into said "Shadow mem Data" data and step 740 transfers said "Mem Data out" data from said SEE-memory device into said Shadow Memory device for intermediate data storage triggered by said internal "Shadow mem Write" signal as said "Shadow mem Data" data during said SMR-mode read cycle operation. Finally step 750 reads valid memory data out of said Shadow Memory device for intermediate data storing during activity of said normal "Mem Read/enable" signal of said SEE-memory device for main data storage out of said "Shadow mem Data" data onto said external data I/O bus.

Figure 4A:
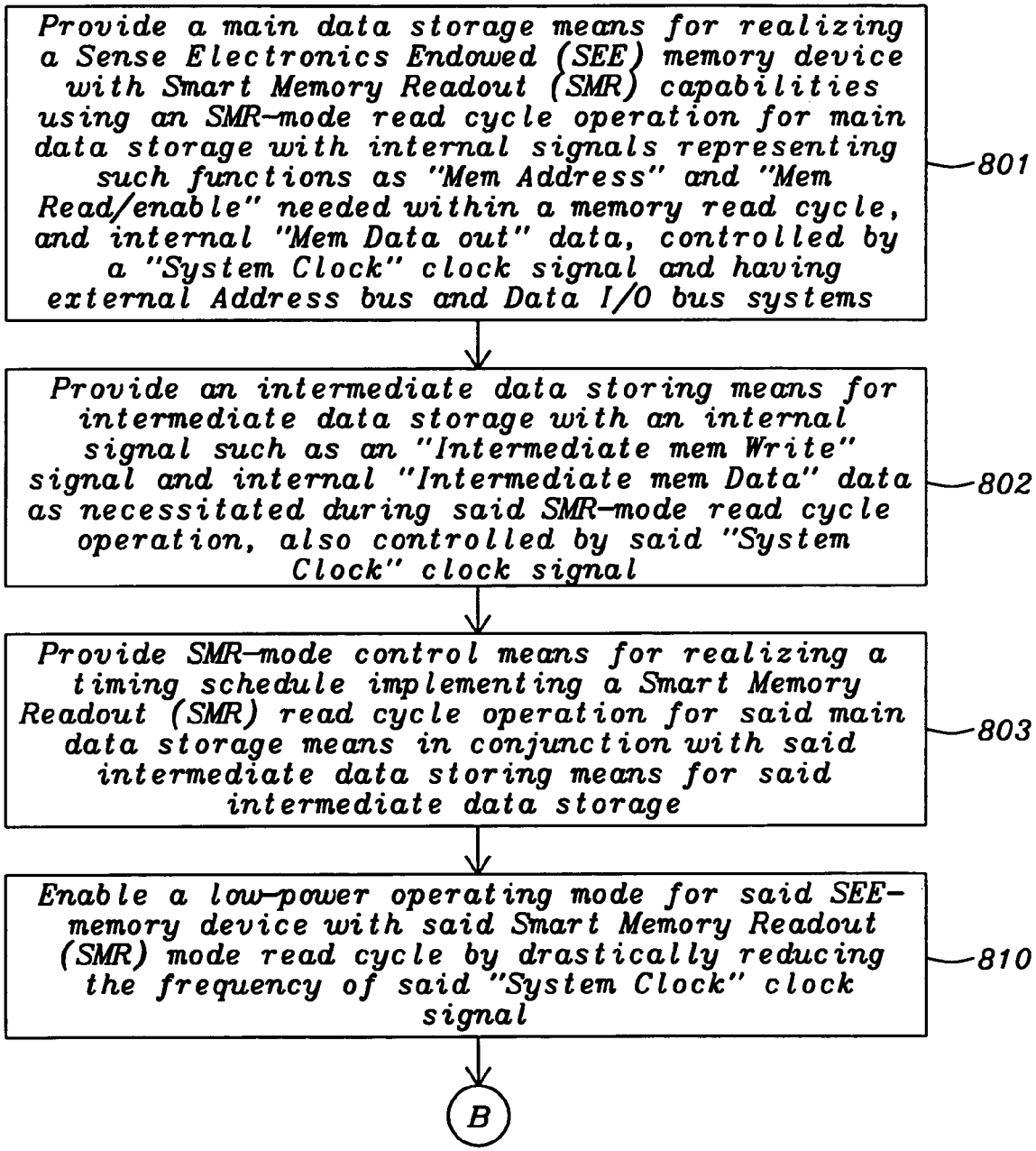
FIGS. 4A & 4B explain with the help of another flow diagram a somewhat more general method for constructing and operating a Sense Electronics Endowed (SEE) memory device with Smart Memory Read (SMR) technique circuit.
Figure 4B:
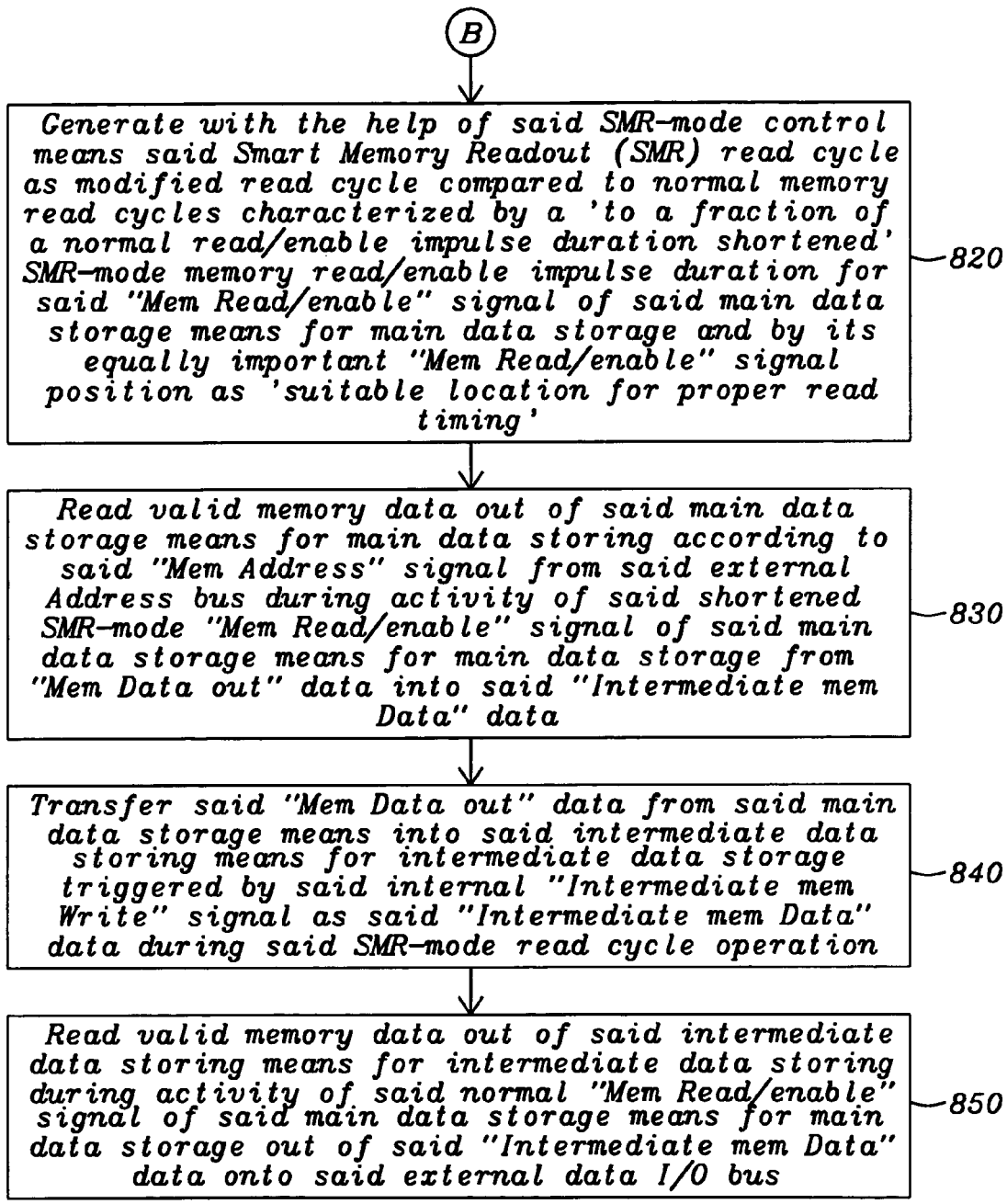

Regarding now the flow diagram given in FIGS. 4A & 4B, a much more general method, explaining the operation of a novel Sense Electronics Endowed (SEE) memory device with Smart Memory Read (SMR) technique circuit according to the invention is now described and its steps defined, wherein as first step 801 a main data storage means for realizing a Sense Electronics Endowed (SEE) memory device with Smart Memory Readout (SMR) capabilities is provided, using a SMR-mode read cycle operation for main data storage with internal signals such as "Mem Address" and "Mem Read/enable" signals needed within a memory read cycle, and internal "Mem Data out" data, controlled by a "System Clock" signal and having external Address bus and Data I/O bus systems. Step 802 provides an intermediate data storing means for intermediate data storage with an internal signal such as an "Intermediate mem Write" signal and internal "Intermediate mem Data" data as necessitated during said SMR-mode read cycle operation, also controlled by said "System Clock" signal and step 803 provides SMR-mode control means for realizing a timing schedule implementing a Smart Memory Readout (SMR) read cycle operation for said main data storage means in conjunction with said intermediate data storing means for said intermediate data storage. Step 810 enables a low-power operating mode for said Sense Electronics Endowed (SEE) memory device with said Smart Memory Readout (SMR) mode read cycle by drastically reducing the frequency of said "System Clock" signal. Step 820 generates with the help of said SMR-mode control means said Smart Memory Readout (SMR) read cycle as modified read cycle compared to normal memory read cycles characterized by a 'to a fraction of a normal read/enable impulse duration shortened' SMR-mode memory read/enable impulse duration for said "Mem Read/enable" signal of said main data storage means for main data storage and by its equally important "Mem Read/enable" signal position as 'suitable location for proper read timing'. Step 830 reads valid memory data out of said main data storage means for main data storing according to said "Mem Address" signals from said external Address bus during activity of said shortened SMR-mode "Mem Read/enable" signal of said main data storage means for main data storage from "Mem Data out" data into said "intermediate mem Data" data and step 840 transfers said "Mem Data out" data from said main data storage means into said intermediate data storing means for intermediate data storage triggered by said internal "Intermediate mem Write" signal as said "Intermediate mem Data" data during said SMR-mode read cycle operation. Step 850 finally reads valid memory data out of said intermediate data storing means for intermediate data storing during activity of said normal "Mem Read/enable" signal of said main data storage means for main data storage out of said "Intermediate mem Data" data onto said external data I/O bus.

Summarizing the essential operational features of the circuit we find, that additional essential reductions in power consumption for Sense Electronics Endowed (SEE) memory devices with said Smart Memory Readout (SMR) mode technique according to the invention can be achieved by drastically reducing the frequency of the system clock, i.e. when operating the system in power save mode, such systems are generally being designed for.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, realizing a Sense Electronics Endowed (SEE) memory device with Smart Memory Read (SMR) technique, comprising:

a Sense Electronics Endowed (SEE) memory device using an SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems;

a Shadow Memory device for intermediate data storage with an internal "Shadow mem Write" signal and internal "Shadow mem Data" data as necessitated during said SMR-mode read cycle operation, also controlled by said "System Clock" signal; and a control logic module for realizing a timing schedule implementing an SMR-mode read cycle operation for said SEE-memory device as an operation with a modified read cycle compared to normal memory read cycles characterized by a 'to a fraction of a normal read/enable impulse duration shortened' SMR-mode memory read/enable impulse duration for said "Mem Read/enable" signal of said SEE-memory device, and by its equally important "Mem Read/enable" signal position as 'suitable location for proper read timing'.

2. The circuit according to claim 1 wherein said Sense Electronics Endowed (SEE) memory device is realized as Dynamic-RAM.

3. The circuit according to claim 2 wherein said Dynamic-RAM is manufactured in bipolar technology.

4. The circuit according to claim 2 wherein said Dynamic-RAM is manufactured in CMOS technology.

5. The circuit according to claim 1 wherein said Sense Electronics Endowed (SEE) memory device is realized as Static-RAM.

6. The circuit according to claim 5 wherein said Static-RAM is manufactured in bipolar technology.

7. The circuit according to claim 5 wherein said Static-RAM is manufactured in CMOS technology.

8. The circuit according to claim 1 wherein said Sense Electronics Endowed (SEE) memory device is realized as Flash-memory.

9. The circuit according to claim 1 wherein said Sense Electronics Endowed (SEE) memory device is realized as Magnetic-RAM.

10. The circuit according to claim 1 wherein said "Mem Read/enable" signal is kept as short as possible for maximum power saving but still guaranteeing proper read-out.

11. The circuit according to claim 1 wherein said "Shadow mem Write" signal is a delayed version of said signal "Mem Read/enable".

12. The circuit according to claim 1 manufactured using modern integrated circuit technologies.

13. The circuit according to claim 1 manufactured as a monolithic integrated circuit.

14. The circuit according to claim 1 manufactured as integrated circuit in monolithic CMOS technology.

15. A circuit, realizing a Sense Electronics Endowed (SEE) memory device with Smart Memory Read (SMR) technique, comprising:

main data storage means using an SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems;

intermediate data storing means for intermediate data storage with an internal "Intermediate mem Write" signal and internal "Intermediate mem Data" data as necessitated during said SMR-mode read cycle operation, also controlled by said "System Clock" signal; and SMR-mode control means for realizing a timing schedule implementing an SMR-mode read cycle operation for said main data storage means in conjunction with said intermediate data storing means for said intermediate data storage, whereby said SRM-mode read cycle is modified compared to normal memory read cycles and characterized by a 'to a fraction of a normal read/enable impulse duration shortened' SMR-mode memory read/enable impulse duration for said "Mem Read/enable" signal of said main data storage means, and by its equally important "Mem Read/enable" signal position as 'suitable location for proper read timing'.

16. The circuit according to claim 15 wherein said main data storage means is realized as Dynamic-RAM.

17. The circuit according to claim 16 wherein said Dynamic-RAM is manufactured in bipolar technology.

18. The circuit according to claim 16 wherein said Dynamic-RAM is manufactured in CMOS technology.

19. The circuit according to claim 15 wherein said main data storage means is realized as Static-RAM.

20. The circuit according to claim 19 wherein said Static-RAM is manufactured in bipolar technology.

21. The circuit according to claim 19 wherein said Static-RAM is manufactured in CMOS technology.

22. The circuit according to claim 15 wherein said Sense Electronics Endowed (SEE) memory device is realized as Flash-memory.

23. The circuit according to claim 15 wherein said Sense Electronics Endowed (SEE) memory device is realized as Magnetic-RAM.

24. The circuit according to claim 15 wherein said "Mem Read/enable" signal is kept as short as possible for maximum power saving but still guaranteeing proper read-out.

25. The circuit according to claim 15 wherein said "Shadow mem Write" signal is a delayed version of said signal "Mem Read/enable".

26. The circuit according to claim 15 wherein said intermediate data storing means is realized as Flip-Flop registers.

27. The circuit according to claim 15 wherein said SMR-mode control means is realized as an asynchronous logic circuit.

28. The circuit according to claim 15 wherein said SMR-mode control means is realized with a clock generator.

29. The circuit according to claim 15 manufactured using modern integrated circuit technologies.

30. The circuit according to claim 15 manufactured as a monolithic integrated circuit.

31. The circuit according to claim 15 manufactured as integrated circuit in monolithic CMOS technology.

32. A method for implementing a Sense Electronics Endowed (SEE) memory device with Smart Memory Readout (SMR) capabilities, comprising:

providing a main data storage means using an SMR-mode read cycle operation for main data storage with internal signals representing functions such as "Mem Address" and "Mem Read/enable" signals needed within a memory read cycle, and internal "Mem Data out" data, controlled by a "System Clock" signal and having external Address bus and Data I/O bus systems;

providing an intermediate data storing means for intermediate data storage with an internal signal such as an "Intermediate mem Write" signal and internal "Intermediate mem Data" data as necessitated during said SMR-mode read cycle operation, also controlled by said "System Clock" signal;

providing SMR-mode control means for realizing a timing schedule implementing a Smart Memory Readout (SMR) read cycle operation for said main data storage means in conjunction with said intermediate data storing means for said intermediate data storage;

enabling a low-power operating mode for said Sense Electronics Endowed (SEE) memory device with said Smart Memory Readout (SMR) mode read cycle by drastically reducing the frequency of said "System Clock" signal;

generating with the help of said SMR-mode control means said Smart Memory Readout (SMR) read cycle as modified read cycle compared to normal memory read cycles characterized by a 'to a fraction of a normal read/enable impulse duration shortened' SMR-mode memory read/enable impulse duration for said "Mem Read/enable" signal of said main data storage means for main data storage and by its equally important "Mem Read/enable" signal position as 'suitable location for proper read timing';

reading valid memory data out of said main data storage means for main data storing according to said "Mem Address" signals from said external Address bus during activity of said shortened SMR-mode "Mem Read/enable" signal of said main data storage means for main data storage from "Mem Data out" data into said "Intermediate mem Data" data;

transferring said "Mem Data out" data from said main data storage means into said intermediate data storing means for intermediate data storage triggered by said internal "Intermediate mem Write" signal as said "Intermediate mem Data" data during said SMR-mode read cycle operation; and reading valid memory data out of said intermediate data storing means for intermediate data storing during activity of said normal "Mem Read/enable" signal of said main data storage means for main data storage out of said "Intermediate mem Data" data onto said external data I/O bus.

33. The method according to claim 32 wherein said main data storage means is realized as Dynamic-RAM.

34. The method according to claim 32 wherein said main data storage means is realized as Static-RAM.

35. The method according to claim 32 wherein said main data storage means is realized as Flash-memory.

36. The method according to claim 32 wherein said main data storage means is realized as Magnetic-RAM.

37. The method according to claim 32 wherein said intermediate data storing means is realized with the help of flip-flop circuits.

38. The method according to claim 32 wherein said SMR-mode control means is realized as an asynchronous logic circuit.

39. The method according to claim 32 wherein said "Mem Read/enable" signal is kept as short as possible for maximum power saving but still guaranteeing proper read-out.

40. The method according to claim 32 wherein said "Intermediate mem Write" signal is a delayed version of said signal "Mem Read/enable".

41. A method implementing a Sense Electronics Endowed (SEE) memory device with Smart Memory Readout (SMR) capabilities, comprising:

providing a Sense Electronics Endowed (SEE) memory device using an SMR-mode read cycle operation for main data storage with internal "Mem Address", "Mem Read/enable" signals, and internal "Mem Data out" data needed within a memory read cycle, controlled by a "System Clock" signal and having external Address bus and Data I/O bus systems;

providing a Shadow Memory device for intermediate data storage with an internal "Shadow mem Write" signal and internal "Shadow mem Data" data as necessitated during said SMR-mode read cycle operation, also controlled by said "System Clock" signal;

providing control logic for realizing a timing schedule implementing a Smart Memory Readout (SMR) read cycle operation for said SEE-memory device for main data storage in conjunction with said Shadow Memory device for said intermediate data storage;

enabling a low-power operating mode for said Sense Electronics Endowed (SEE) memory device with said Smart Memory Readout (SMR) mode read cycle by drastically reducing the frequency of said "System Clock" signal;

generating said Smart Memory Readout (SMR) read cycle as modified read cycle compared to normal memory read cycles characterized by a 'to a fraction of a normal read/enable impulse duration shortened' SMR-mode memory read/enable impulse duration for said "Mem Read/enable" signal of said SEE-memory device for main data storage and by its equally important "Mem Read/enable" signal position as 'suitable location for proper read timing';

reading valid memory data out of said SEE-memory device for main data storing according to said "Mem Address" signals from said external Address bus during activity of said shortened SMR-mode "Mem Read/enable" signal of said SEE-memory device for main data storage from "Mem Data out" data into said "Shadow mem Data" data;

transferring said "Mem Data out" data from said SEE-memory device into said Shadow Memory device for intermediate data storage triggered by said internal "Shadow mem Write" signal as said "Shadow mem Data" data during said SMR-mode read cycle operation; and reading valid memory data out of said Shadow Memory device for intermediate data storing during activity of said normal "Mem Read/enable" signal of said SEE-memory device for main data storage out of said "Shadow mem Data" data onto said external data I/O bus.

* * * * *

UNITED STATES PATENT AND TRADEMARK OFFICE
CERTIFICATE OF CORRECTION

| | | |
|---|---|---|
| PATENT NO. | : 7,277,340 B2 | Page 1 of 1 |
| APPLICATION NO. | : 10/876802 | |
| DATED | : October 2, 2007 | |
| INVENTOR(S) | : Thomas Aakjer | |

It is certified that error appears in the above-identified patent and that said Letters Patent is hereby corrected as shown below:

On The Title Page, Item (73), delete, "Dialog Semiconductor GmbH, Kircheim/Teck-Nabern (DE)" and replace with -- Dialog Semiconductor GmbH, Kirchheim/Teck - Nabern (DE) --.

Signed and Sealed this

First Day of January, 2008

JON W. DUDAS
*Director of the United States Patent and Trademark Office*